United States Patent
Nakajima

(10) Patent No.: US 11,339,494 B2
(45) Date of Patent: May 24, 2022

(54) REAR SURFACE INCIDENT TYPE LIGHT RECEIVING DEVICE COMPRISING AN UPPERMOST PART OF AN ELECTRODE WITH A LARGER DIAMETER THAN LOWERMOST PART OF THE ELECTRODE

(71) Applicant: Mitsubishi Electric Corporation, Tokyo (JP)

(72) Inventor: Yasuo Nakajima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 36 days.

(21) Appl. No.: 16/888,238

(22) Filed: May 29, 2020

(65) Prior Publication Data

US 2020/0292379 A1    Sep. 17, 2020

Related U.S. Application Data

(62) Division of application No. 15/718,452, filed on Sep. 28, 2017, now Pat. No. 10,746,592.

(30) Foreign Application Priority Data

Mar. 9, 2017  (JP) ................................ 2017-045198

(51) Int. Cl.
  *C25D 7/08*    (2006.01)
  *C25D 5/12*    (2006.01)
  (Continued)

(52) U.S. Cl.
  CPC ................. *C25D 7/08* (2013.01); *C25D 3/12* (2013.01); *C25D 3/48* (2013.01); *C25D 5/022* (2013.01);
  (Continued)

(58) Field of Classification Search
  CPC ... C25D 5/12; C25D 5/48; C25D 7/08; C25D 3/48; C25D 3/12; C25D 5/022;
  (Continued)

(56) References Cited

U.S. PATENT DOCUMENTS 4,771,325 A    9/1988 Cheng et al.
2002/0000510 A1    1/2002 Matsuda
(Continued)

FOREIGN PATENT DOCUMENTS

JP    H05-062858 A    3/1993
JP    H05-267708 A    10/1993
(Continued)

OTHER PUBLICATIONS

An Office Action; "Notice of Reasons for Refusal", by the Japanese Patent Office dated Nov. 10, 2020, which corresponds to Japanese Patent Application No. 2017-045198 and is related to U.S. Appl. No. 16/888,238; with English language translation.

*Primary Examiner* — Jennifer D Bennett
(74) *Attorney, Agent, or Firm* — Studebaker & Brackett PC

(57) ABSTRACT

According to the present invention, a method for manufacturing a rear surface incident type light receiving device including a substrate, a light receiving unit formed on a surface of the substrate and an electrode formed on the light receiving unit and electrically connected to the light receiving unit includes a first step of performing, after formation of a part of the electrode, a characteristic inspection of the rear surface incident type light receiving device by applying a probe to a part of the electrode and a second step of reducing an area of the electrode in a plan view.

7 Claims, 8 Drawing Sheets

(51) Int. Cl.
*C25D 5/48* (2006.01)
*C25D 3/48* (2006.01)
*C25D 3/12* (2006.01)
*G01J 1/02* (2006.01)
*C25D 5/02* (2006.01)
*H01L 31/107* (2006.01)
*H01L 21/66* (2006.01)
*H01L 31/0224* (2006.01)
*G01J 1/42* (2006.01)
*G01J 5/02* (2022.01)

(52) U.S. Cl.
CPC ............... *C25D 5/12* (2013.01); *C25D 5/48* (2013.01); *G01J 1/0295* (2013.01); *H01L 22/14* (2013.01); *H01L 22/20* (2013.01); *H01L 31/022408* (2013.01); *H01L 31/1075* (2013.01); *G01J 1/42* (2013.01); *G01J 5/024* (2013.01)

(58) Field of Classification Search
CPC ............... H01L 31/1075; H01L 22/20; H01L 31/022408; H01L 22/14; G01J 1/0295; G01J 1/42; G01J 5/024
See application file for complete search history.

(56) References Cited

U.S. PATENT DOCUMENTS

| | | |
|---|---|---|
| 2002/0113282 A1 | 8/2002 | Yoneda et al. |
| 2002/0135036 A1 | 9/2002 | Terano et al. |
| 2003/0164444 A1 | 9/2003 | Yoneda et al. |
| 2005/0194037 A1 | 9/2005 | Asai |
| 2014/0332978 A1 | 11/2014 | Yasuda et al. |

FOREIGN PATENT DOCUMENTS

| | | | |
|---|---|---|---|
| JP | 2002-252366 A | | 9/2002 |
| JP | 2004-200202 A | | 7/2004 |
| JP | 2004200202 A | * | 7/2004 |
| JP | 2014-220330 A | | 11/2014 |

* cited by examiner

US 11,339,494 B2

REAR SURFACE INCIDENT TYPE LIGHT RECEIVING DEVICE COMPRISING AN UPPERMOST PART OF AN ELECTRODE WITH A LARGER DIAMETER THAN LOWERMOST PART OF THE ELECTRODE

CROSS-REFERENCE TO RELATED APPLICATIONS

This application is a Divisional of U.S. patent application Ser. No. 15/718,452 filed Sep. 28, 2017, which claims benefit of priority to Japanese Patent Application No. 2017-045198 filed Mar. 9, 2017, the entire contents of which are incorporated herein by reference.

BACKGROUND OF THE INVENTION

Field

The present invention relates to a rear surface incident type light receiving device used in an optical fiber communication system, and a method for manufacturing thereof.

Background

A rear surface incident type light receiving device is known as a light receiving device used in an optical fiber communication system. The rear surface incident type light receiving device is characterized by receiving light incident from a rear surface of a substrate. For example, JP 2002-252366 A discloses such a rear surface incident type light receiving device.

A problem to be solved by the rear surface incident type light receiving device is to achieve an increase in operation speed and a reduction in cost. The achievement of an increase in operation speed is desired because the amount of data exchanged on the Internet has been continuously increasing. Also, a cost reduction is constantly required by users.

In order to increase the operation speed of the rear surface incident type light receiving device, it is effective to reduce an area of an electrode formed on a surface side of the substrate. The electrode has a parasitic capacitance generated between the electrode and a semiconductor layer, which is formed below the electrode, or the like. An increase in the parasitic capacitance inhibits an increase in operation speed. The parasitic capacitance increases as the area of the electrode increases. Accordingly, the parasitic capacitance can be reduced by reducing the area of the electrode, so that an increase in operation speed can be achieved.

To reduce the cost of the rear surface incident type light receiving device, it is effective to perform a characteristic inspection of the light receiving device in a wafer state. If the characteristic inspection can be performed in the wafer state, a device which has turned out to be defective can be prevented from being mounted on a submount or the like. Therefore, an extra manufacturing cost can be suppressed.

However, it is still difficult to achieve both an increase in operation speed and implementation of the characteristic inspection in the wafer state. If the area of the electrode is reduced to achieve an increase in operation speed, it is difficult to apply a probe for inspection to the electrode, so that the characteristic inspection in the wafer state cannot be performed. On the contrary, if the area of the electrode is increased for the characteristic inspection to be performed in the wafer state, an increase in operation speed cannot be achieved due to an increase in parasitic capacitance.

SUMMARY

The present invention has been made to solve the above-mentioned problems, and an object of the present invention is to provide a rear surface incident type light receiving device and a method for manufacturing the rear surface incident type light receiving device which is capable of performing a characteristic inspection in a wafer state and has a small electrode parasitic capacitance.

The features and advantages of the present invention may be summarized as follows.

According to the present invention, a method for manufacturing a rear surface incident type light receiving device including a substrate, a light receiving unit formed on a surface of the substrate and an electrode formed on the light receiving unit and electrically connected to the light receiving unit includes a first step of performing, after formation of a part of the electrode, a characteristic inspection of the rear surface incident type light receiving device by applying a probe to a part of the electrode and a second step of reducing an area of the electrode in a plan view.

According to the present invention, a rear surface incident type light receiving device includes a substrate, a light receiving device formed on a surface of the substrate and an electrode formed on the light receiving unit and electrically connected to the light receiving unit, wherein an outermost diameter of a surface of an uppermost part of the electrode is larger than an outermost diameter of a surface of a lowermost part of the electrode.

Other and further objects, features and advantages of the invention will appear more fully from the following description.

DESCRIPTION OF EMBODIMENTS

First Embodiment

Figure 1:
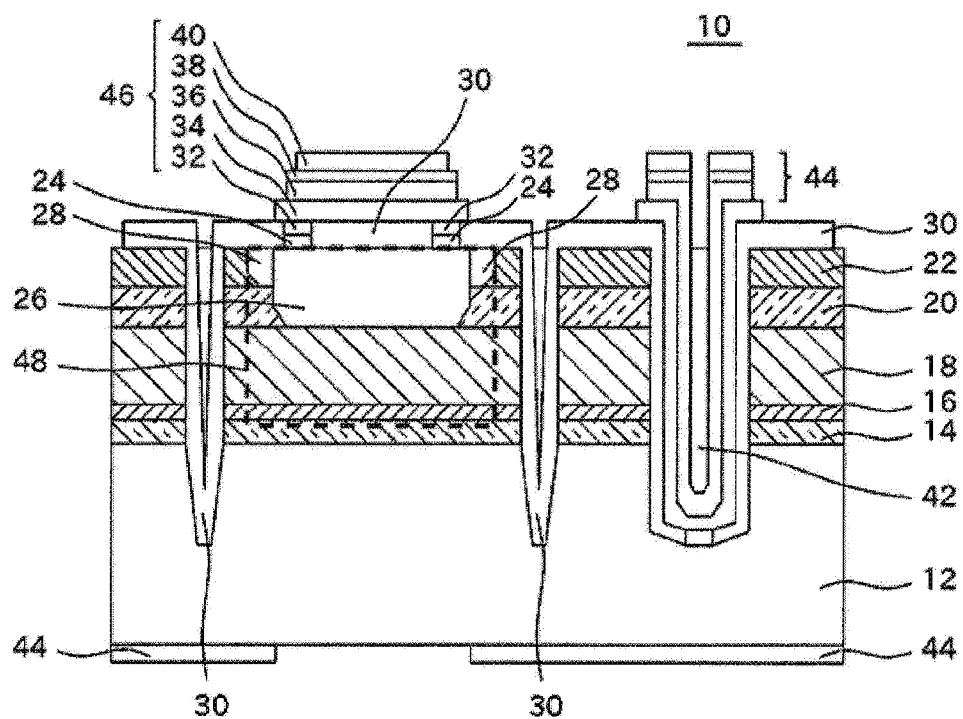
FIG. 1 is a sectional view of a rear surface incident type light receiving device manufactured using a method for manufacturing according to a first embodiment of the present invention.

A configuration of a rear surface incident type light receiving device according to a first embodiment will be described. In this embodiment, the light receiving device is an APD (Avalanche photodiode) and the operation speed of the light receiving device is 25 Gb/s or higher. FIG. 1 is a sectional view of a rear surface incident type light receiving device 10 according to the first embodiment. Note that the sectional views including FIG. 1 are schematic views, and dimensional ratios in each sectional view are different from the actual dimensional ratios.

An AlInAs multiplication layer 14, a p-InP field alleviating layer 16, an InGaAs light absorbing layer 18, an AlInAs window layer 20, an InP window layer 22, and an InGaAs contact layer 24 are stacked on an n-InP substrate 12 in this order.

The InGaAs contact layer 24 is formed in a ring shape and used for feeding power to a p-type diffusion region 26.

The p-type diffusion region 26 is formed by diffusing impurities in the AlInAs window layer 20 and the InP window layer 22. The outermost diameter in a plan view of the P-type diffusion region 26 is set to be equal to or less than 20 µm. This is because there is a need for suppressing a junction capacitance to allow the rear surface incident type light receiving device 10 to operate at a high speed.

A guard ring region 28 is formed around the p-type diffusion region 26 which is formed in the InP window layer 22.

An SiN film 30 is formed on the InP window layer 22. The SiN film 30 is formed to be substantially antireflective to light in a band of 1.2 to 1.7 µm, which is used in an optical fiber communication system. The SiN film 30 plays a role of protecting a surface.

A contact electrode 32 is formed on the InGaAs contact layer 24. The contact electrode 32 is a ring-shaped electrode having a structure in which Pt, Ti, Pt, and Au layers are formed in this order from the bottom. A part of the contact electrode 32 is alloyed with the InGaAs contact layer 24.

Figure 2:
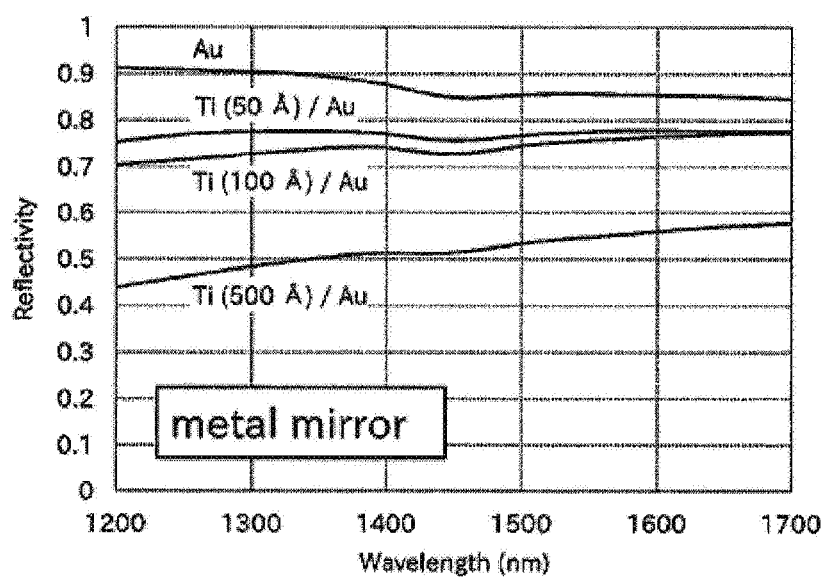
FIG. 2 is a graph illustrating a wavelength dependence of a reflectance when the configuration of a mirror electrode is changed.

A mirror electrode 34 is formed on the contact electrode 32 and the SiN film 30. The mirror electrode 34 has a structure in which Ti and Au layers are formed, and is formed to have a size larger than the outer periphery of the contact electrode 32. Specifically, the outermost diameter in a plan view of the mirror electrode 34 is, for example, 5 µm to 20 µm. FIG. 2 illustrates a wavelength dependence of a reflectance of the mirror electrode 34 when the thickness of the Ti layer is changed. As seen from FIG. 2, when the thickness of the Ti layer is 100 Å or less, a reflectance of 70% or more with respect to light in a band of 1.2 to 1.7 µm, which is used in the optical fiber communication system, can be obtained. Considering that the adhesion between the SiN film 30 and the mirror electrode 34 may deteriorate if there is no Ti layer, the thickness of the Ti layer of the mirror electrode 34 is desirably set to 10 Å to 100 Å.

A barrier electrode 36 is formed on the mirror electrode 34. The barrier electrode 36 has a structure in which Ti, Pt, Au layers are formed, and is formed to have substantially the same size as the outer periphery of the contact electrode 32. The barrier electrode 36 includes the Pt layer, which is a barrier metal, which provides a barrier effect for solder used when the rear surface incident type light receiving device 10 is mounted on a submount or the like.

A plating power feeding layer 38 is formed on the barrier electrode 36. The plating power feeding layer 38 has a structure in which Ti and Au layers are formed.

A plating layer 40 is formed on the plating power feeding layer 38. The plating layer 40 is formed of Au.

An electrode composed of the contact electrode 32, the mirror electrode 34, the barrier electrode 36, the plating power feeding layer 38, and the plating layer 40, which are described above, is referred to as a P-electrode 46.

A region surrounded by a broken line in FIG. 1 represents a light receiving unit 48, and has a function of receiving light incident from the substrate 12 side.

N-electrodes 44 are formed on both the front surface and the rear surface of the rear surface incident type light receiving device 10. The N-electrode 44 formed on the front surface is formed above a groove 42. The N-electrode 44 formed on the rear surface is formed on the rear surface of the n-InP substrate 12. The N-electrodes 44 which are formed at two locations as described above are used differently depending on the implementation of the rear surface incident type light receiving device. A current is caused to flow between the P-electrode 46 and N-electrode 44, thereby feeding power to a junction region in the light receiving unit 48.

A method for manufacturing the rear surface incident type light receiving device according to the first embodiment of the present invention will be described. FIGS. 3 to 9 are sectional views each illustrating a manufacturing step of the first embodiment.

Figure 3:
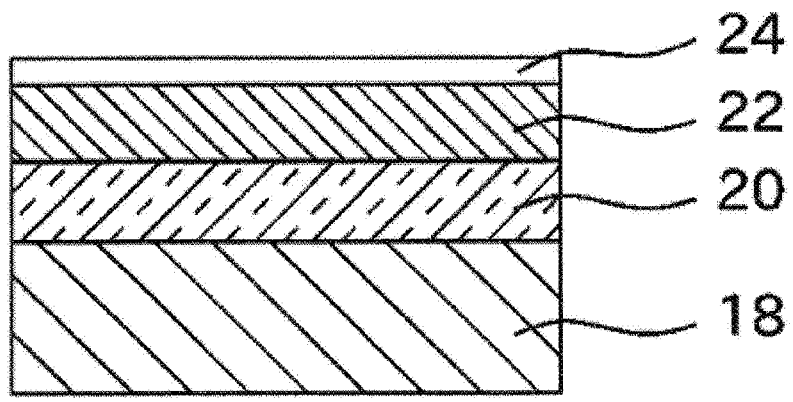
FIG. 3 is a sectional view of the rear surface incident type light receiving device for explaining a process until the formation of a contact layer in the method for manufacturing the rear surface incident type light receiving device according to the first embodiment of the present invention.

First, a structure illustrated in FIG. 3 is formed. This structure is formed by stacking the AlInAs multiplication layer 14, the p-InP field alleviating layer 16, the InGaAs light absorbing layer 18, the AlInAs window layer 20, the InP window layer 22, and the InGaAs contact layer 24 on the n-InP substrate 12. In FIG. 3, the illustration of the n-InP substrate 12, the AlInAs multiplication layer 14, and the p-InP field alleviating layer 16 is omitted.

Figure 4:
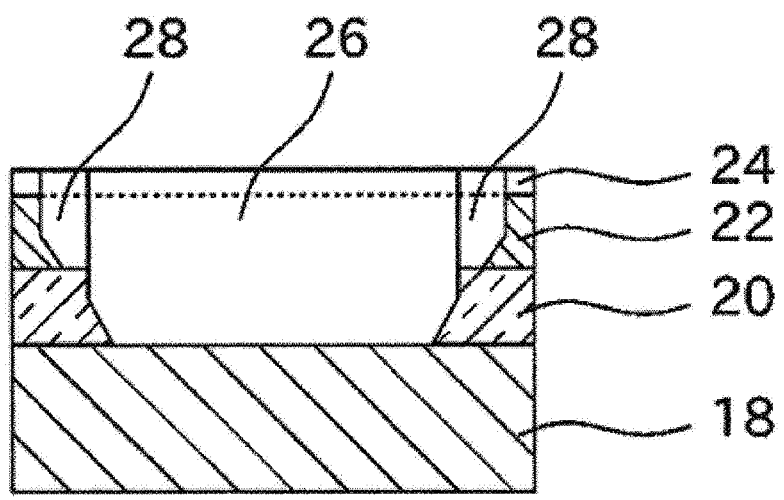
FIG. 4 is a sectional view of the rear surface incident type light receiving device for explaining a process until the formation of a guard ring region in the method for manufacturing the rear surface incident type light receiving device according to the first embodiment of the present invention.

Next, as illustrated in FIG. 4, the p-type diffusion region 26 and the guard ring region 28 are formed. The p-type diffusion region 26 is formed by diffusing a p-type impurity. The guard ring region 28 is also formed by diffusing a p-type impurity.

Figure 5:
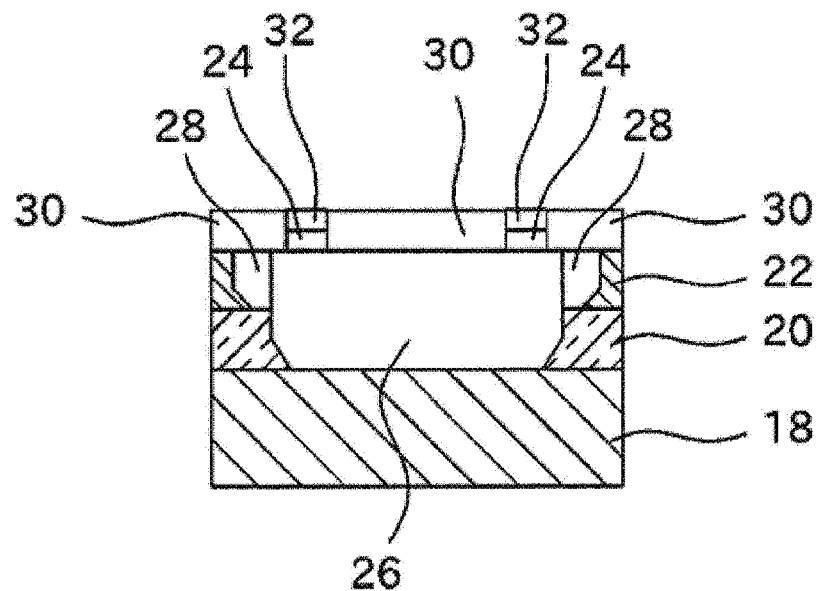
FIG. 5 is a sectional view of the rear surface incident type light receiving device for explaining a process until the formation of a contact electrode in the method for manufacturing the rear surface incident type light receiving device according to the first embodiment of the present invention.

Next, a structure illustrated in FIG. 5 is formed. To form this structure, the InGaAs contact layer 24 is first formed into a ring shape. Next, the SiN film 30 is stacked and the SiN film 30 formed on the InGaAs contact layer 24 is removed. Next, a resist pattern is formed on the SiN film 30 in such a manner that an opening is formed above the InGaAs contact layer 24 and the Pt, Ti, Pt, and Au layers are deposited in the opening, and then the contact electrode 32 is formed by liftoff.

Figure 6:
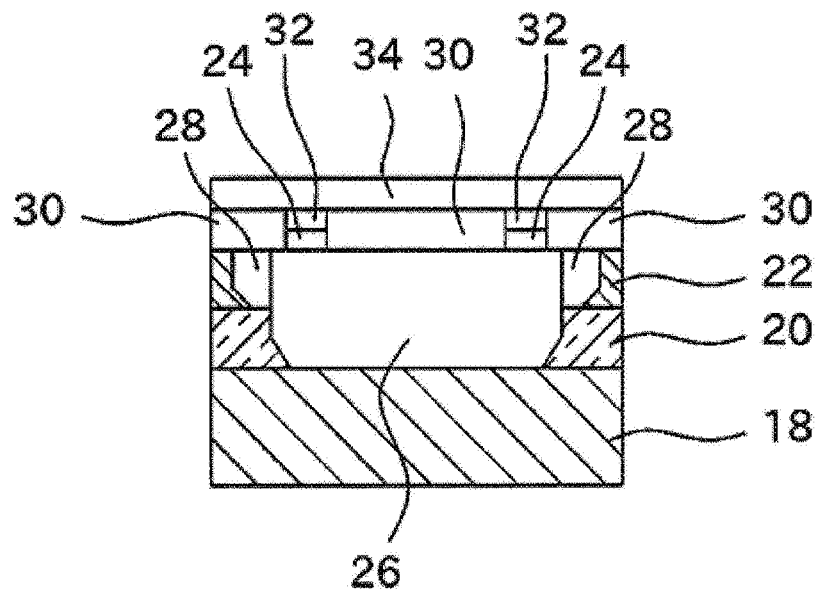
FIG. 6 is a sectional view of the rear surface incident type light receiving device for explaining a process until the formation of the mirror electrode in the method for manufacturing the rear surface incident type light receiving device according to the first embodiment of the present invention.

Next, a structure including the mirror electrode 34 as illustrated in FIG. 6 is formed. The mirror electrode 34 does not include Pt. Accordingly, the mirror electrode 34 is also formed by liftoff, like the contact electrode 32. Alternatively, the mirror electrode 34 is formed by etching using a resist as a mask. The outermost diameter in a plan view of the mirror electrode 34 is 40 µm to 100 µm.

Figure 7:
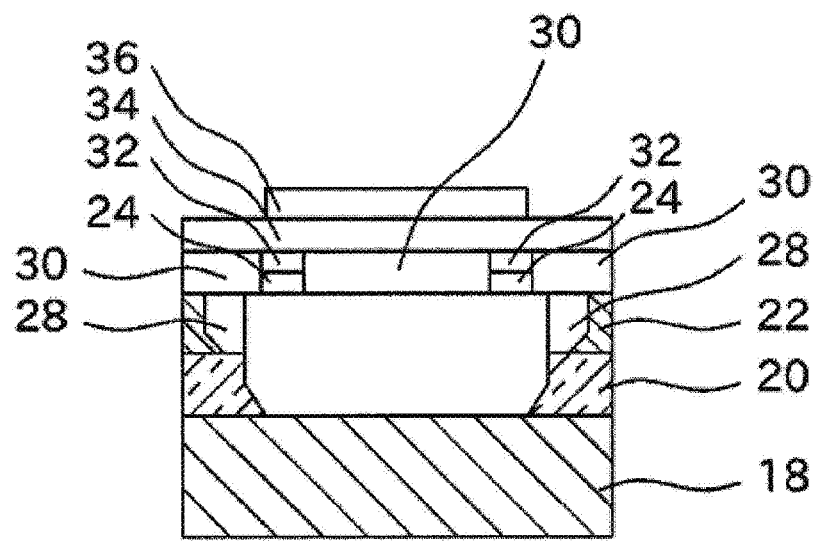
FIG. 7 is a sectional view of the rear surface incident type light receiving device for explaining a process until the formation of a barrier electrode in the method for manufacturing the rear surface incident type light receiving device according to the first embodiment of the present invention.

Next, the barrier electrode 36 is formed as illustrated in FIG. 7.

Next, a characteristic inspection is performed by applying a probe for inspection to one or both of the mirror electrode 34 and the barrier electrode 36. Since the outermost diameter of the mirror electrode 34 is 40 µm or more, the area of the mirror electrode 34 is large enough to apply the probe. Accordingly, the characteristic inspection can be performed in the middle of a wafer process.

Figure 8:
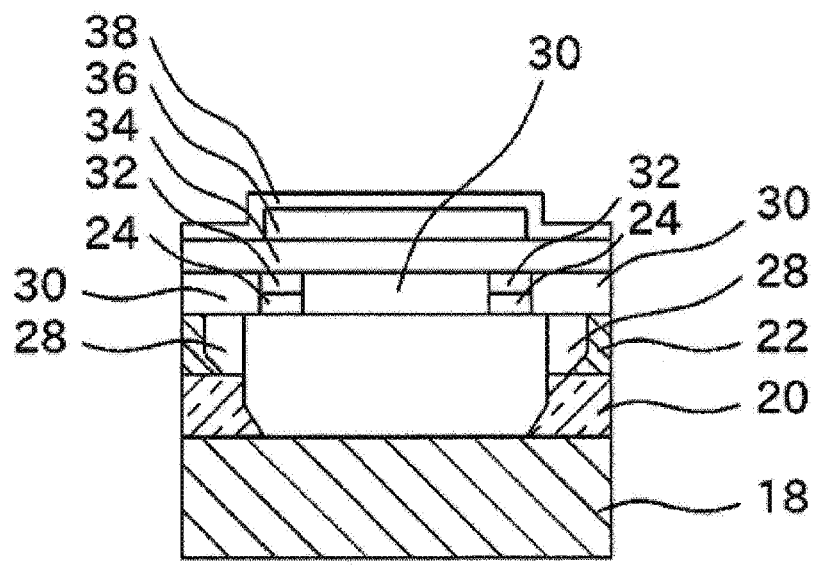
FIG. 8 is a sectional view of the rear surface incident type light receiving device for explaining a process until the formation of a plating power feeding layer in the method for manufacturing the rear surface incident type light receiving device according to the first embodiment of the present invention.

Next, the plating power feeding layer 38 is stacked as illustrated in FIG. 8. In this step, the Ti layer and the Au layer are sequentially stacked on the entire surface.

Figure 9:
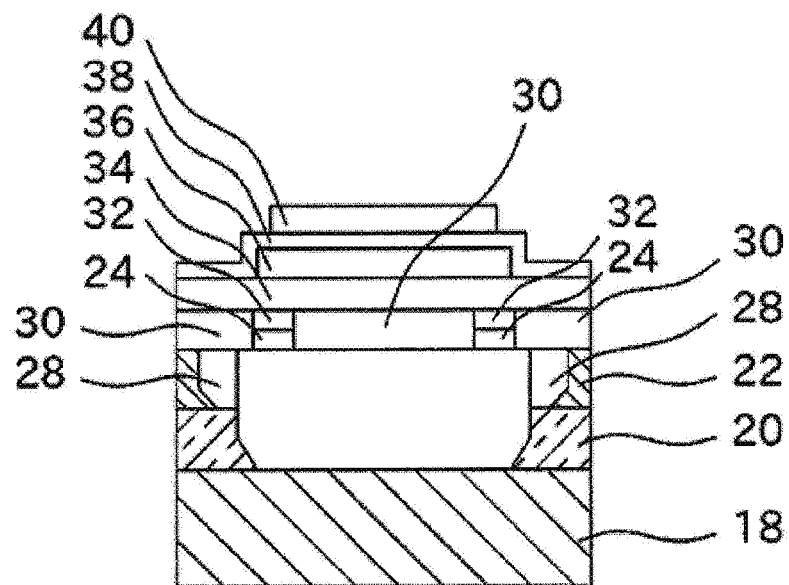
FIG. 9 is a sectional view of the rear surface incident type light receiving device for explaining a process until the formation of a plating layer in the method for manufacturing the rear surface incident type light receiving device according to the first embodiment of the present invention.

Next, the plating layer 40 is formed as illustrated in FIG. 9. The plating layer 40 is formed in such a manner that a resist pattern stacked on the plating power feeding layer 38 is formed and an electrolytic plating method in which plating is performed by causing a current to flow to the plating power feeding layer 38 is employed using Au as a plating material.

Figure 10:
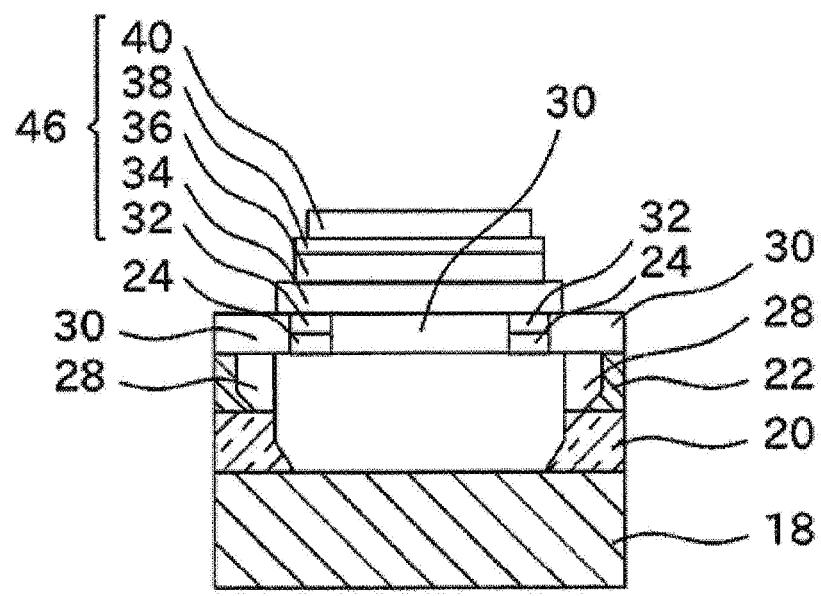
FIG. 10 is a sectional view of the rear surface incident type light receiving device for explaining a process until the formation of a P-electrode in the method for manufacturing the rear surface incident type light receiving device according to the first embodiment of the present invention.

Next, as illustrated in FIG. 10, the Au layer and the Ti layer are etched using a resist having a size large enough to cover the plating layer 40, thereby forming the P-electrode 46. In this case, the area of the mirror electrode 34 decreases as the area of the plating power feeding layer 38 decreases.

The use of the method for manufacturing rear surface incident type light receiving device according to the first embodiment makes it possible to perform the characteristic inspection of the light receiving device in a wafer state. Since the electrode to which the probe is applied during the characteristic inspection in the wafer state has a multi-layer structure including the mirror electrode 34 and the barrier electrode 36, a damage to the light receiving unit can be reduced. Further, Ti is used for the layer of the mirror electrode 34 that is in contact with the SiN film 30, so that electrode peeling is less likely to occur. Since the thickness of the Ti layer is set to be equal to or less than 100 Å, a reflectance of 70% or more can be obtained. Finally, since the outermost diameter in a plan view of the P-electrode is 20 µm or less, a parasitic capacitance of the electrode decreases, which enables the rear surface incident type light receiving device 10 to operate at a high speed. Specifically, an operation at a speed of 25 Gb/s or higher can be achieved.

In this embodiment, among the layers forming the P-electrode, the area of the mirror electrode 34 is increased for the characteristic inspection in the wafer state. Alternatively, the area of the plating power feeding layer 38 may be increased. In this case, the characteristic inspection may be performed after formation of the plating power feeding layer 38, and then, the area of the plating power feeding layer 38 may be reduced by etching after formation of the plating layer 40.

Second Embodiment

Figure 11:
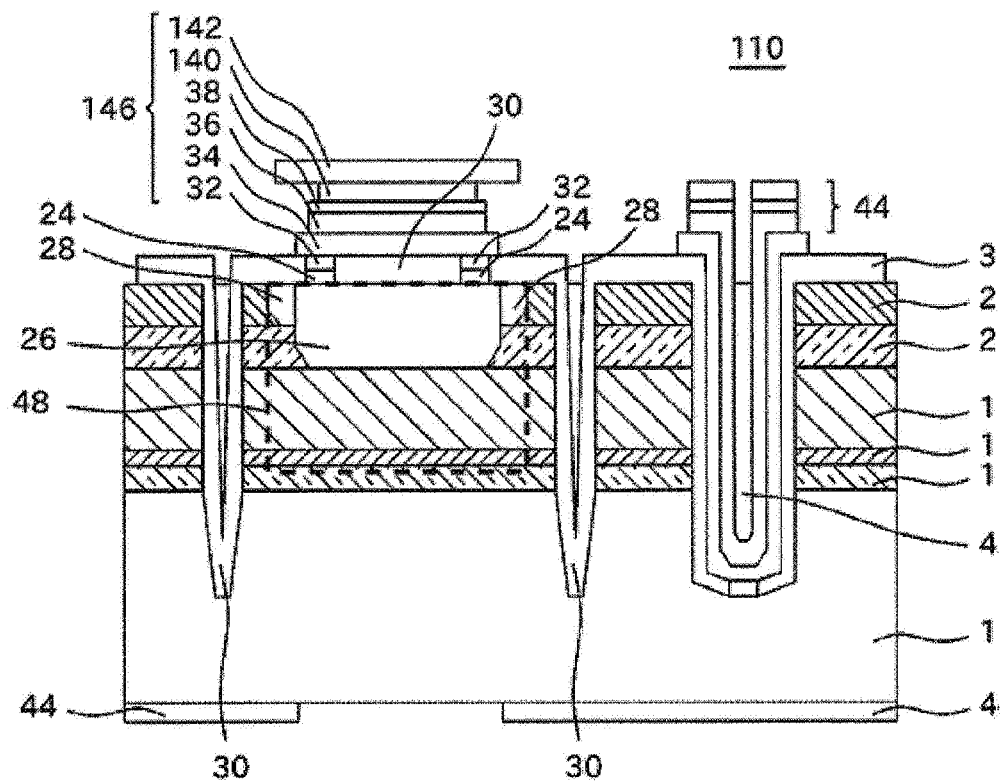
FIG. 11 is a sectional view of a rear surface incident type light receiving device manufactured using a method for manufacturing according to a second embodiment of the present invention.

A configuration of a rear surface incident type light receiving device according to a second embodiment will be described. Also in this embodiment, the light receiving device is an APD (Avalanche photodiode) and the operation speed of the light receiving device is 25 Gb/s or higher. FIG. 11 is a sectional view of the rear surface incident type light receiving device 110 according to the second embodiment. The layers up to the plating power feeding layer 38, which are formed from the rear surface toward the front surface thereof, in the configuration of the rear surface incident type light receiving device 110 according to the second embodiment are the same as those of the rear surface incident type light receiving device 10 according to the first embodiment. A configuration above the plating power feeding layer 38 will be described below.

As illustrated in FIG. 11, a plating layer 140 is formed on the plating power feeding layer 38. The plating layer 140 is formed of Au.

A plating layer 142 is further formed on the plating layer 140. The plating layer 142 is formed to have a size larger than the contact electrode 32. Specifically, the outermost diameter in a plan view of the plating layer 142 is, for example, 40 µm to 100 µm.

An electrode composed of the contact electrode 32, the mirror electrode 34, the barrier electrode 36, the plating power feeding layer 38, the plating layer 140, and the plating layer 142, which are described above, is referred to as a P-electrode 146.

The barrier electrode 36 may be omitted as long as the plating layer 140 is formed of Ni or the like, which provides a barrier effect for solder, instead of using Au as a material for the plating layer 140.

A method for manufacturing the rear surface incident type light receiving device 110 according to the second embodiment of the present invention will be described. FIGS. 12 to 15 are sectional views each illustrating a manufacturing process of the second embodiment. In this embodiment, unlike in the first embodiment, the characteristic inspection is not performed immediately after formation of the mirror electrode, and thus a mirror electrode with a large area is not formed. Otherwise the layers up to the plating power feeding layer 38 are formed by the same method for manufacturing as that of the first embodiment, and thus only a method for forming a configuration above the plating power feeding layer 38 will be described below.

Figure 12:
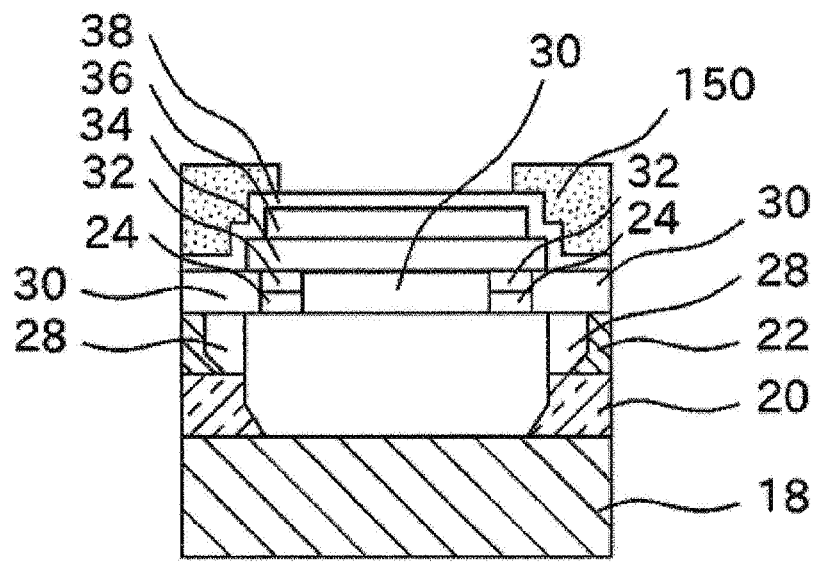
FIG. 12 is a sectional view of the rear surface incident type light receiving device for explaining a process until the formation of a resist in the method for manufacturing the rear surface incident type light receiving device according to the second embodiment of the present invention.

A resist 150 is formed as illustrated in FIG. 12. The resist 150 has an opening for forming the plating layer 140.

Figure 13:
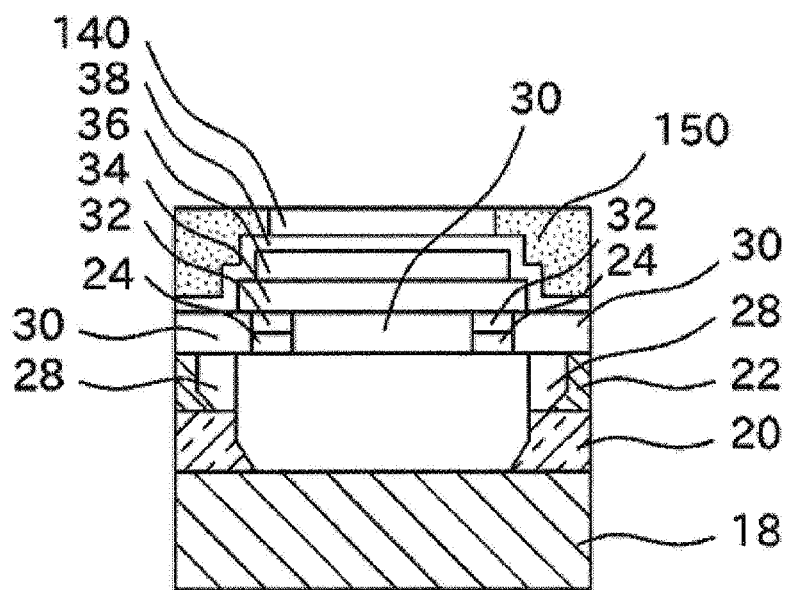
FIGS. 13 and 14 are sectional views of the rear surface incident type light receiving device for explaining a process until the formation of plating layers in the method for manufacturing the rear surface incident type light receiving device according to the second embodiment of the present invention.

Next, the plating layer 140 is formed as illustrated in FIG. 13. The plating layer 140 is formed by the electrolytic plating method in which plating is performed by causing a current to flow to the plating power feeding layer 38 by using Au as a plating material.

Figure 14:
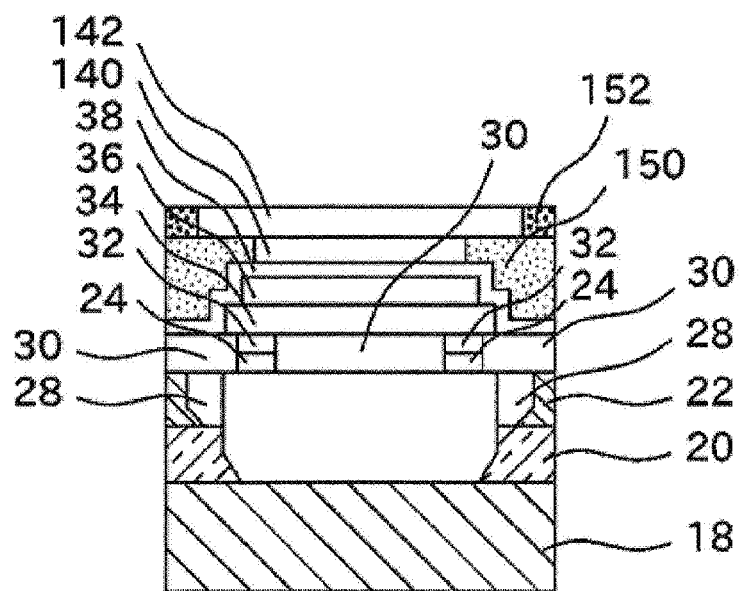

Next, a resist 152 is further formed and the plating layer 142 is formed in the opening as illustrated in FIG. 14. The resist 152 has the opening at a location where the plating layer 142 is formed. The size of the opening is the same as the size of the plating layer 142 and is larger than the contact electrode 32. The plating layer 142 is formed by the electrolytic plating method in which plating is performed by causing a current to flow to the plating power feeding layer 38 by using Au as a plating material.

Figure 15:
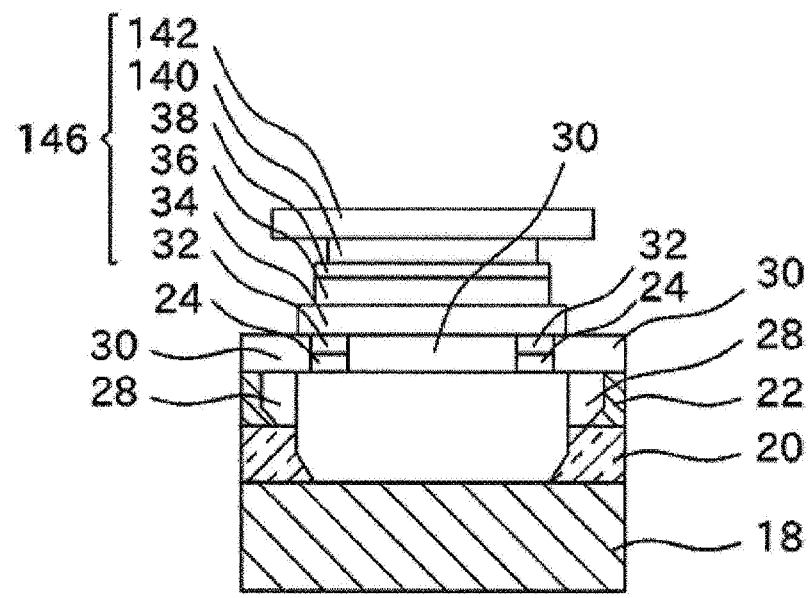
FIG. 15 is a sectional view of the rear surface incident type light receiving device for explaining a process until the formation of a P-electrode in the method for manufacturing the rear surface incident type light receiving device according to the second embodiment of the present invention.

Next, the P-electrode 146 is formed by removing the resist 150 and the resist 152 as illustrated in FIG. 15.

Figure 16:
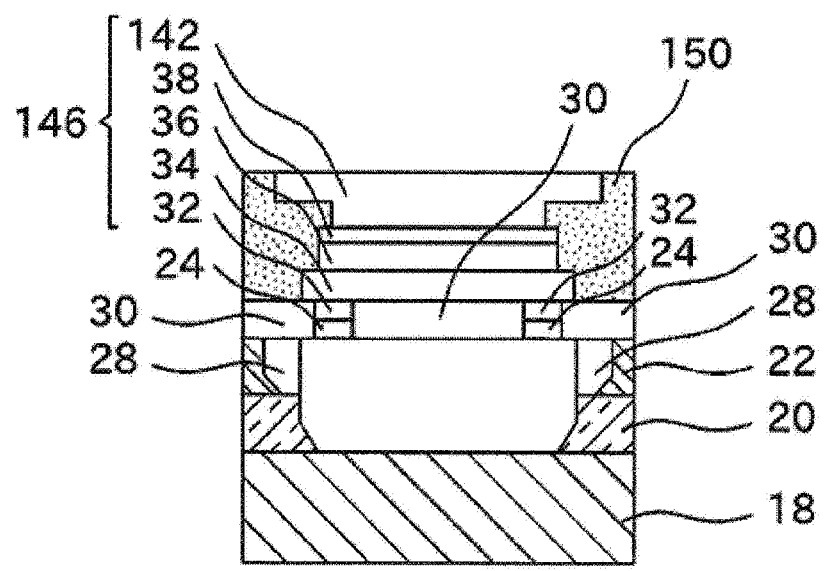
FIG. 16 is a sectional view of the rear surface incident type light receiving device for explaining a process until the formation of a plating layer in the method for manufacturing the rear surface incident type light receiving device according to the second embodiment of the present invention.

Instead of forming the plating layer 140 and the plating layer 142 as described above, the plating layer 142 may be formed after formation of the resist 150 into a T-shape as illustrated in FIG. 16.

The use of the rear surface incident type light receiving device according to the second embodiment makes it possible to perform the characteristic inspection of the light receiving device in a wafer state. Since the plating layer 142 has a large area, the probe for characteristic inspection can be applied to the P-electrode.

In the case of mounting the rear surface incident type light receiving device 110 on a submount or the like, since the plating layer 142 has a large area, a bonding area for a bonding wire to be attached to the P-electrode 146 is increased, which leads to an increase in assembly strength.

Further, since the outer diameter in a plan view of the mirror electrode, which is located closest to the semiconductor layer formed below the P-electrode among the layers forming the P-electrode and has a largest effect on the parasitic capacitance of the P-electrode, is 20 μm or less, the rear surface incident type light receiving device 110 can perform a high-speed operation. Specifically, an operation at a speed of 25 Gb/s or higher can be performed.

In the method for manufacturing according to the present invention, the characteristic inspection is performed in the wafer state by using an electrode having an area that is large enough to apply the probe, and the area of the electrode is reduced after the inspection. Consequently, it is possible to manufacture the rear surface incident type light receiving device capable of performing the characteristic inspection in the wafer state and has a small electrode parasitic capacitance.

Obviously many modifications and variations of the present invention are possible in the light of the above teachings. It is therefore to be understood that within the scope of the appended claims the invention may be practiced otherwise than as specifically described.

The invention claimed is:

1. A rear surface incident type light receiving device comprising:
   a substrate;
   a light receiving unit formed on a surface of the substrate; and
   an electrode formed on the light receiving unit and electrically connected to the light receiving unit,
   wherein an outermost diameter of a surface of an uppermost part of the electrode is larger than an outermost diameter of a surface of a lowermost part of the electrode,
   the outermost diameter of the surface of the lowermost part of the electrode is 5 μm to 20 μm, and
   the outermost diameter of the surface of the uppermost part of the electrode is 40 μm to 100 μm.

2. The rear surface incident type light receiving device according to claim 1, wherein a lowermost layer among layers forming the electrode is a mirror electrode, and the mirror electrode reflects light incident from a rear surface of the substrate.

3. A rear surface incident type light receiving device comprising:
   a substrate;
   a light receiving unit formed on a surface of the substrate; and
   an electrode formed on the light receiving unit and electrically connected to the light receiving unit,
   wherein an outermost diameter of a surface of an uppermost part of the electrode is larger than an outermost diameter of a surface of a lowermost part of the electrode,
   a lowermost layer among layers forming the electrode is a mirror electrode, and the mirror electrode reflects light incident from a rear surface of the substrate, and
   the mirror electrode is formed of a Ti layer and an Au layer that are formed in this order from a bottom, and a thickness of the Ti layer is 10 Å to 100 Å.

4. A rear surface incident type light receiving device comprising:
   a substrate;
   a light receiving unit formed on a surface of the substrate; and
   an electrode formed on the light receiving unit and electrically connected to the light receiving unit, wherein
   an outermost diameter of a surface of an uppermost part of the electrode is larger than an outermost diameter of a surface of a lowermost part of the electrode,
   a lowermost layer among layers forming the electrode is a mirror electrode, and the mirror electrode reflects light incident from a rear surface of the substrate,
   a plating power feeding layer, a first plating layer, and a second plating layer are formed above the mirror electrode in this order as layers forming the electrode,
   the first plating layer and the second plating layer are each formed using Au as a plating material, and
   the second plating layer is an uppermost layer of the electrode.

5. A rear surface incident type light receiving device comprising:
   a substrate;
   a light receiving unit formed on a surface of the substrate; and
   an electrode formed on the light receiving unit and electrically connected to the light receiving unit, wherein
   an outermost diameter of a surface of an uppermost part of the electrode is larger than an outermost diameter of a surface of a lowermost part of the electrode,
   a lowermost layer among layers forming the electrode is a mirror electrode, and the mirror electrode reflects light incident from a rear surface of the substrate, a plating power feeding layer, a first plating layer, and a second plating layer are formed above the mirror electrode in this order as layers forming the electrode, the first plating layer is formed using Ni as a plating material, the second plating layer is formed using Au as a plating material, and the second plating layer is an uppermost layer of the electrode.

6. A method for manufacturing a rear surface incident type light receiving device including a substrate, a light receiving unit formed on a surface of the substrate and an electrode formed on the light receiving unit and electrically connected to the light receiving unit, wherein an outermost diameter of a surface of an uppermost part of the electrode is larger than an outermost diameter of a surface of a lowermost part of the electrode, a lowermost layer among layers forming the electrode is a mirror electrode, and the mirror electrode reflects light incident from a rear surface of the substrate, a plating power feeding layer, a first plating layer, and a second plating layer are formed above the mirror electrode in this order as layers forming the electrode, the first plating layer and the second plating layer are each formed using Au as a plating material, and the second plating layer is an uppermost layer of the electrode comprising:

a step of forming a first resist on the plating power feeding layer, the first resist having an opening at a location where the first plating layer is formed;

a step of forming the first plating layer by an electrolytic plating method using the plating power feeding layer as an electrode;

a step of forming a second resist on the first resist, the second resist having an opening at a location where the second plating layer is formed; and a step of forming the second plating layer by an electrolytic plating method using the plating power feeding layer as an electrode.

7. A method for manufacturing a rear surface incident type light receiving device including a substrate, a light receiving unit formed on a surface of the substrate and an electrode formed on the light receiving unit and electrically connected to the light receiving unit, wherein an outermost diameter of a surface of an uppermost part of the electrode is larger than an outermost diameter of a surface of a lowermost part of the electrode, a lowermost layer among layers forming the electrode is a mirror electrode, and the mirror electrode reflects light incident from a rear surface of the substrate, a plating power feeding layer, a first plating layer, and a second plating layer are formed above the mirror electrode in this order as layers forming the electrode, the first plating layer and the second plating layer are each formed using Au as a plating material, and the second plating layer is an uppermost layer of the electrode comprising:

a step of forming a first resist on the plating power feeding layer, the first resist having an opening at a location where the first plating layer is formed;

a step of forming a second resist on the first resist, the second resist having an opening at a location where the second plating layer is formed; and a step of forming the first plating layer and the second plating layer by an electrolytic plating method using the plating power feeding layer as an electrode.

* * * * *